(12) United States Patent
Gao

(10) Patent No.: US 9,838,029 B1
(45) Date of Patent: Dec. 5, 2017

(54) ADAPTIVELY CONTROLLED DUTY CYCLE CLOCK GENERATION CIRCUIT

(71) Applicant: Analog Devices Global, Hamilton (BM)

(72) Inventor: Ting Gao, Shanghai (CN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/369,087

(22) Filed: Dec. 5, 2016

(51) Int. Cl.
*H03M 1/12* (2006.01)
*H03K 3/017* (2006.01)
*H03K 3/027* (2006.01)
*H03K 3/023* (2006.01)
*H03K 5/151* (2006.01)
*H03K 5/156* (2006.01)
*H03K 7/08* (2006.01)
*H03M 1/00* (2006.01)
*H03L 7/089* (2006.01)

(52) U.S. Cl.
CPC .......... *H03M 1/1245* (2013.01); *H03K 3/017* (2013.01); *H03K 3/023* (2013.01); *H03K 3/027* (2013.01); *H03K 5/1515* (2013.01); *H03K 5/1565* (2013.01); *H03K 7/08* (2013.01); *H03L 7/0891* (2013.01); *H03M 1/00* (2013.01); *H03M 1/12* (2013.01)

(58) Field of Classification Search
CPC ........ H03M 1/00; H03M 1/12; H03K 5/1565; H03K 7/08; H03L 7/0891
USPC ......... 341/155, 156, 118; 327/175, 172, 156
See application file for complete search history.

(56) References Cited

U.S. PATENT DOCUMENTS

2003/0112046 A1* 6/2003 Atallah ................ H03K 5/1565
327/175
2004/0075462 A1* 4/2004 Kizer ................... H03K 5/1565
326/29
2014/0368366 A1* 12/2014 Galton .................. H03M 3/386
341/143

* cited by examiner

Primary Examiner — Joseph Lauture
(74) Attorney, Agent, or Firm — Schwegman Lundberg & Woessner, P.A.

(57) ABSTRACT

A clock generation circuit coupled to an integrator circuit uses a variable resistance that is adjusted in a transconductance bias feedback circuit. This resistance is calibrated to the reciprocal of the transconductance of the input amplifier. The product of the adjusted resistance and a capacitance in the clock generation circuit provides a time constant for the settling time of the integrator and controls a pulse width of an adaptively controlled duty cycle output clock.

20 Claims, 8 Drawing Sheets

ADAPTIVELY CONTROLLED DUTY CYCLE CLOCK GENERATION CIRCUIT

FIELD OF THE DISCLOSURE

This document pertains generally, but not by way of limitation, to the field of analog-to-digital converters and, in particular, to clock generation in ADCs.

BACKGROUND

Analog-to-digital converters (ADCs) are used to convert an unknown input voltage into a digital representation. Most ADCs work discretely. Among the discrete time ADCs, the pipeline ADCs and Delta-Sigma ADCs operate in a time division configuration including a sampling phase and an integration phase.

During the sampling phase, the integrator in the ADC will sample the input voltage. During the integrating phase, the ADC integrates or amplifies and then compares the result with a reference voltage. The unknown input voltage is applied to the input of the integrator and allowed to ramp for a fixed time period. Then a known reference voltage of opposite polarity is applied to the integrator and is allowed to ramp until the integrator output returns to zero. The input voltage is computed as a function of the reference voltage, the constant run-up time period, and the measured run-down time period.

The sampling time and integrating time for the integrator circuit are controlled by two non-overlapping clocks. The clock source is typically from a local oscillator having a fixed 50% duty cycle. While the pulse widths of the two clocks are the same, the time constants of the sampling phase clock and the integrating phase clock are not the same. The integrating phase typically has a larger time constant since it is determined by the input transconductance of an amplifier of the integrator and the integrating capacitance. The input transconductance is limited and the time constant of the sampling phase is determined by a sampling switch resistance and sampling capacitance. The resistance is usually relatively small.

In designing the amplifier for the integrator, the time constant should be 1/N of the pulse width of the integrating phase. Such a time constant enables the settling accuracy to be $N*\tau$ where $\tau$ is the time constant and the settling accuracy of $N*\tau$ means an accuracy of $e^{-N}$. If N=7, the settling accuracy is 0.09%. However, since the amplifier has process limitations in slow skew, the transconductance of the amplifier is smaller than a typical value. Thus, the time constant turns out to be larger than 1/N of the pulse width and the settling accuracy is reduced. The amplifier current may be increased to compensate for the inaccuracy but then the ADC power usage also increases.

SUMMARY OF THE DISCLOSURE

The present inventors have recognized, among other things, a need for improved total harmonic distortion performance over ADC fabrication process variations. For example, a clock generation circuit coupled to an integrator circuit uses a variable resistance that is adjusted in a transconductance bias feedback circuit. This resistance is calibrated to the reciprocal of the transconductance of the input amplifier. The product of the adjusted resistance and a capacitance in the clock generation circuit provides a time constant for the settling time of the integrator and controls a pulse width of an adaptively controlled duty cycle output clock.

One embodiment is for a clock generation circuit that generates an adaptively controlled duty cycle output clock for an analog-to-digital converter having integrator amplifiers. The clock generation circuit includes an adaptive duty cycle control circuit to generate the adaptively controlled duty cycle output clock signal from an input clock having a duty cycle. A non-overlapping clock generation circuit is coupled to the adaptive duty cycle control circuit, the non-overlapping clock generation circuit is configured to generate a plurality of non-overlapping clocks where the duty cycle of the plurality of output clocks is controlled by the adaptively controlled duty cycle output clock signal. The adaptive duty cycle control circuit includes a current generator circuit including an amplifier, a transistor, and a resistance coupled in series, wherein the resistance is determined based on an input transconductance of the integrator amplifier. Another circuit including a transistor and capacitance coupled in series. The circuit is coupled in parallel with the current generator circuit, where the transistor is configured to act as a current mirror and the duty cycle of the input clock is adaptively controlled based on a product of the resistance and the capacitance and the product is proportional to a settling time of the integrator.

Another embodiment for an analog-to-digital converter. The converter includes a plurality of integrator circuits, each circuit comprising an input amplifier configured to have an input current. A clock generation circuit is coupled to the plurality of integrator circuits and configured to generate an adaptively controlled duty cycle output clock signal based on an input clock. The clock generation circuit comprises a current generator circuit including an amplifier, a transistor, and a resistance coupled in series, wherein the resistance is adjusted based on an input transconductance of the integrator amplifier. Another circuit includes a transistor and capacitance coupled in series and an amplifier having a reference voltage coupled to a first input and a second input coupled to a common node between the transistor and capacitance. The circuit is coupled in parallel with the current generator circuit, wherein the transistor is configured to act as a current mirror and the duty cycle of the input clock is adaptively controlled based on a product of the resistance and the capacitance and the product is proportional to a settling time of the integrator wherein the amplifier outputs the adaptively controlled duty cycle output clock signal to the integrator circuit. A transconductance bias circuit is coupled to the clock generation circuit. The transconductance bias circuit is configured to adjust the resistance based on the input current.

Another embodiment includes a method for generating an adaptively controlled duty cycle output clock for an analog-to-digital converter with an integrator amplifier. The method generates an input current in the integrator amplifier. The input current is compared to a current mirror current comprising a resistance. The resistance is adjusted until the input current is equal to the current mirror current. The adaptively controlled duty cycle output clock is generated based on a time constant of the adjusted resistance and a capacitance, wherein the time constant is proportional to a settling time of the integrator amplifier.

This section is intended to provide an overview of the subject matter of the present patent application. It is not intended to provide an exclusive or exhaustive explanation of the invention. The detailed description is included to provide further information.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Integrator circuits in discrete time ADCs typically use non-overlapping clocks as sampling and integrating clock to perform the analog-to-digital conversion. The clock source is typically from a local oscillator which has a fixed 50% duty cycle and the clock is input to a non-overlapping clock generator to generate both the sampling clock and the integrating clock. A time constant of the amplifier circuit of the integrator ideally is 1/N of the pulse width of the integrating phase. Due to amplifier process limitations, the transconductance of the amplifier is smaller than a typical value. Thus, the time constant turns out to be larger than 1/N of the pulse width and the settling accuracy is reduced. These problems may be illustrated by reference to FIGS. 1-3 as described subsequently.

Figure 1:
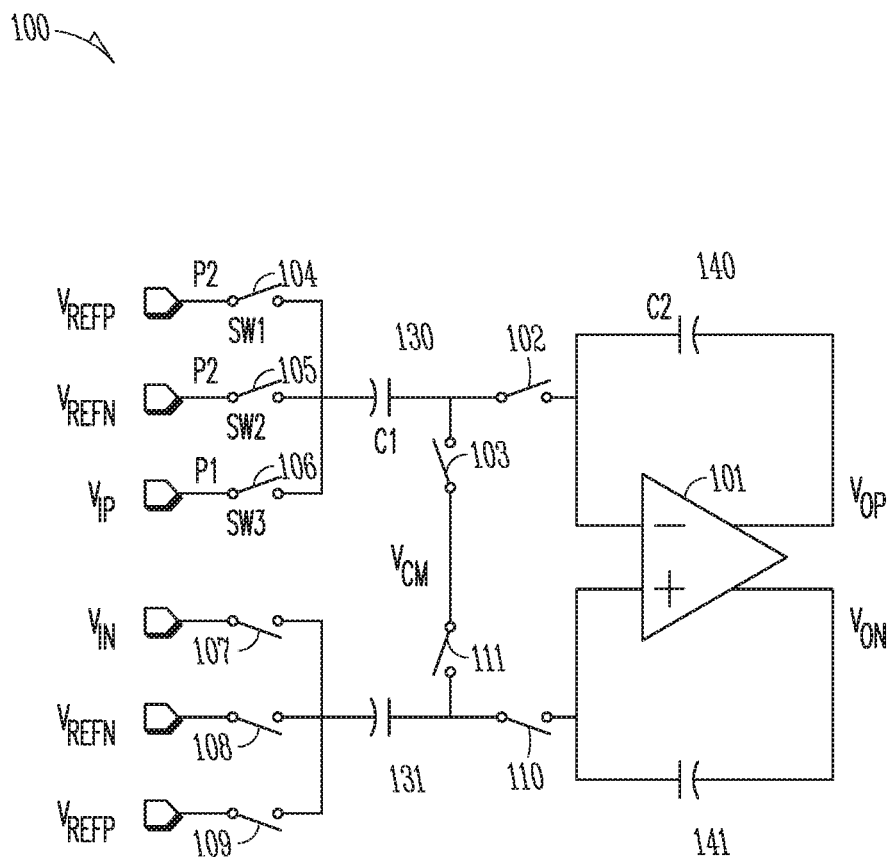
FIG. 1 is a schematic diagram of an integrator circuit, such as in accordance with various embodiments.

FIG. 1 is a schematic diagram of a differential integrator circuit 100, such as in accordance with various embodiments. The circuit 100 comprises a differential amplifier 101, a plurality of switches 102-111, two sampling capacitors 130, 131, and two feedback capacitors 140, 141.

Three of the input switches 104-106 are coupled to a positive voltage sampling capacitor 130. An input positive reference voltage $V_{refp}$ node is coupled to a first input switch 104. An input negative reference voltage $V_{refn}$ node is coupled to a second input switch 105. A positive input voltage $V_{ip}$ node, coupled to be the input voltage to be sampled, is coupled to a third input switch 106.

Another three of the input switches 107-109 are coupled to a negative voltage sampling capacitor 131. The input positive reference voltage $V_{refp}$ node is coupled to a fourth input switch 109. The input negative reference voltage $V_{refn}$ node is coupled to a fifth input switch 108. A negative input voltage $V_{in}$ node, coupled to be the input voltage to be sampled, is coupled to a sixth input switch 107.

The positive voltage sampling capacitor 130 is coupled to one side of a sampling phase switch 103 and an integration phase switch 102. The other side of the integration phase switch 102 is coupled to an input (e.g., negative input) of the amplifier 101 and feedback capacitor 140. The other side of the sampling phase switch 103 is coupled to a common mode voltage $V_{CM}$ (e.g., circuit virtual ground).

Similarly, the negative voltage sampling capacitor 131 is coupled to one side of a sampling phase switch 111 and an integration phase switch 110. The other side of the integration phase switch 110 is coupled to an input (e.g., positive input) of the amplifier 101 and feedback capacitor 141. The other side of the sampling phase switch 111 is coupled to a common mode voltage $V_{CM}$ (e.g., circuit virtual ground).

Figure 2:
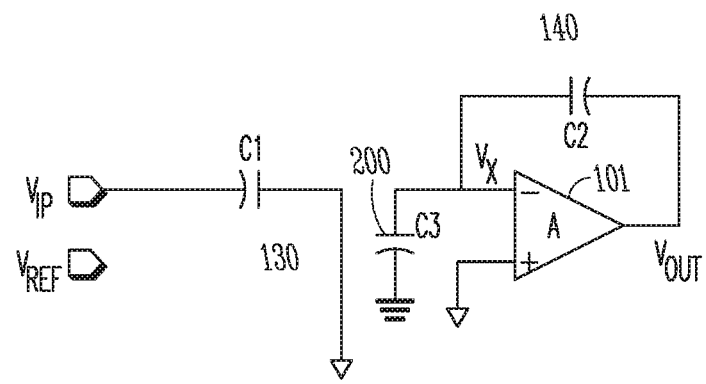
FIG. 2 is a schematic diagram of the integrator circuit in a sampling phase, such as in accordance with the embodiment of FIG. 1.
Figure 3:
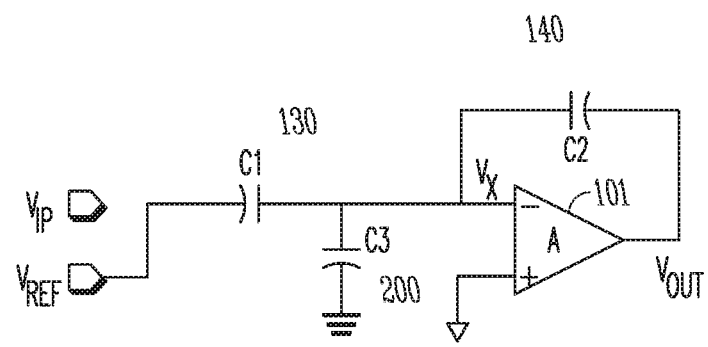
FIG. 3 is a schematic diagram of the integrator circuit in an integration phase, such as in accordance with the embodiment of FIG. 1.

FIGS. 2 and 3 illustrate the operation of the circuit of FIG. 1 in a single ended mode. When the sampling phase switches 103, 111 are closed, the voltages from the input nodes $V_{ip}$, $V_{in}$ are coupled to their respective sampling capacitors 130, 131 to charge the capacitors 130, 131. This circuit is illustrated in FIG. 2.

FIG. 2 is a schematic diagram of the integrator circuit in a sampling phase, such as in accordance with the embodiment of FIG. 1. For purposes of brevity and clarity, this circuit illustrates only the positive sampling portion of FIG. 1. However, the negative sampling portion of FIG. 1 operates in a substantially similar manner.

This circuit shows that the positive input voltage $V_{ip}$ node switch 106 is closed to connect the $V_{ip}$ voltage to its respective sampling capacitor 130. The input reference voltage node switches 104, 105 are open so that those nodes are not connected to anything. The input voltage $V_{ip}$ may then be able to charge the sampling capacitor 130. The sampling phase switch 103 is closed to connect the other side of the sampling capacitor 130 to the common mode voltage (e.g., virtual ground). The integrator phase switch 102 is open to disconnect the amplifier 101 from the sampling capacitor 130 and, thus, produce an input capacitance 200 to the amplifier 101.

FIG. 3 is a schematic diagram of the integrator circuit in an integration phase, such as in accordance with the embodiment of FIG. 1. For purposes of brevity and clarity, this circuit illustrates only the positive integrating portion of FIG. 1. However, the negative integrating portion of FIG. 1 operates in a substantially similar manner.

This circuit shows that the positive input voltage $V_{ip}$ node switch 106 is open to disconnect the $V_{ip}$ from its respective sampling capacitor 130. One or both of the input reference voltage node switches 104, 105 is closed so that one of these nodes is now connected to one side of the sampling capacitor 130. The integrator phase switch 102 is closed to connect the other side of the sampling capacitor 130 to the input of the amplifier 101. The sampling phase switch 103 is open to remove the common mode voltage from the circuit. Thus, the sampled voltage stored in the sampling capacitor 130 is free to be applied to the amplifier 101.

The amplifier 101 in the above circuits of FIGS. 1-3 has finite gain and finite gain bandwidth. This will affect the settling accuracy, and then deteriorate the total harmonic distortion (THD) of the signal. However, the time constant during the sampling phase is much smaller because the switch resistance is usually relatively very small. In designing the amplifier 101 for the integrator, it is desirable to have a time constant of 1/N of the pulse width (i.e., N represents a number of time constants) of the integration phase clock so that the settling accuracy can be N*τ where τ is the time constant of the integrator circuit's amplifier. However, since the transistors in the amplifier have fabrication process variations across the silicon wafer, the transconductance of the input of the amplifier may be smaller than a typical value, making the time constant larger and the settling accuracy reduced from a desired value.

For example, transistors formed in slower portions of an integrated circuit wafer may have smaller transconductance values and, thus, worse THD as compared to faster portions of the wafer. Increasing the current in the amplifier may increase the transconductance and improve the THD in the slower portions of the wafer. This would result in an undesirable increase in the circuit power requirements.

The adaptive controlled duty cycle circuit of the present embodiments keeps the integration phase clock pulse width at N times of the time constant of the amplifier. Using the adaptive controlled duty cycle circuit, the settling time accuracy for the integration amplifier may be increased to compensate for fabrication process variations. In an ideal amplifier, N is approximately in a range of 8-10 to approximately provide a desirable −80 dB THD.

Figure 4:
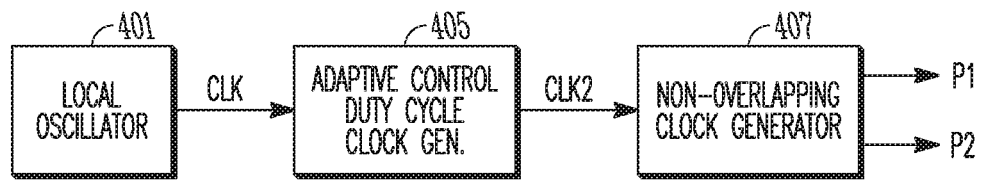
FIG. 4 is a block diagram of an adaptively controlled duty cycle clock generation circuit, such as in accordance with various embodiments.

FIG. 4 is a block diagram of an adaptively controlled duty cycle clock generation circuit, such as in accordance with various embodiments. The block diagram includes a local oscillator circuit 401, an adaptively controlled duty cycle clock generation circuit 405, and a non-overlapping clock generation circuit 407. The adaptively controlled duty cycle clock generation circuit 405 is discussed subsequently in greater detail with reference to FIG. 9.

The local oscillator circuit 401 is configured to generate a clock CLK. The local oscillator circuit 401 may be a clock circuit or a voltage controlled oscillator that generates the clock CLK which is usually having a 50% duty cycle.

The clock CLK from the oscillator circuit 401 is input to the adaptive control duty cycle clock generation circuit 405. This circuit generates adaptively generates the adaptive duty cycle clock CLK2 that enables the integration phase clock pulse to have a pulse width of N*τ.

Figure 5:
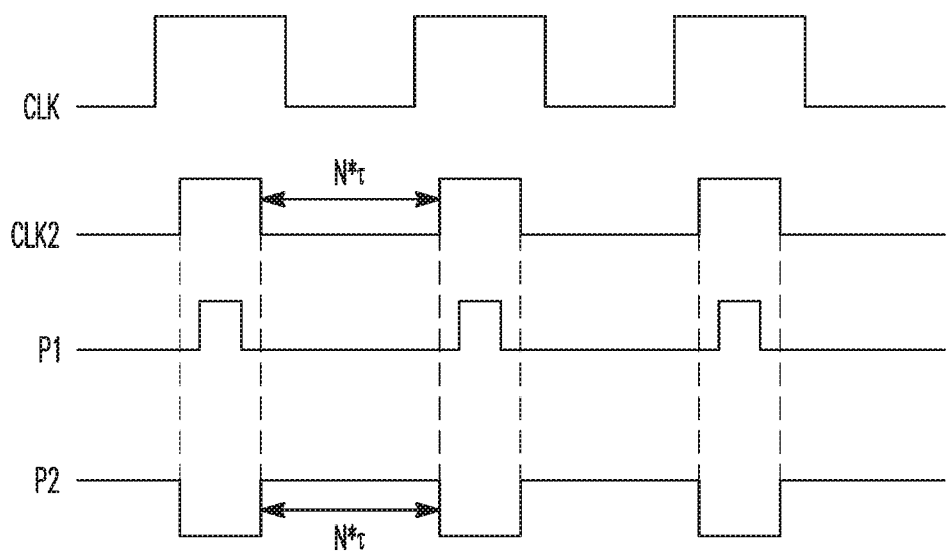
FIG. 5 is a timing diagram of non-overlapping clocks with an adaptively controlled duty cycle clock, such as in accordance with various embodiments.

FIG. 5 is a timing diagram of non-overlapping clocks with an adaptively controlled duty cycle clock, such as in accordance with various embodiments. The CLK signal represents the 50% duty cycle clock generated by the oscillator circuit 401 of FIG. 4. The CLK2 signal represents the adaptive duty cycle clock generated from the CLK signal by the adaptive control duty cycle clock generation circuit 405 of FIG. 4. Pulses of the CLK2 signal are separated by N*τ.

The CLK2 signal is input to the non-overlapping clock generation 407 to generate the sampling phase clock P1 and the integrating phase clock P2 from the CLK2 clock. It can be seen that the P1 and P2 clocks are non-overlapping clocks and the pulses of P2 are now adaptively controlled to be N*τ wide.

Figure 6:
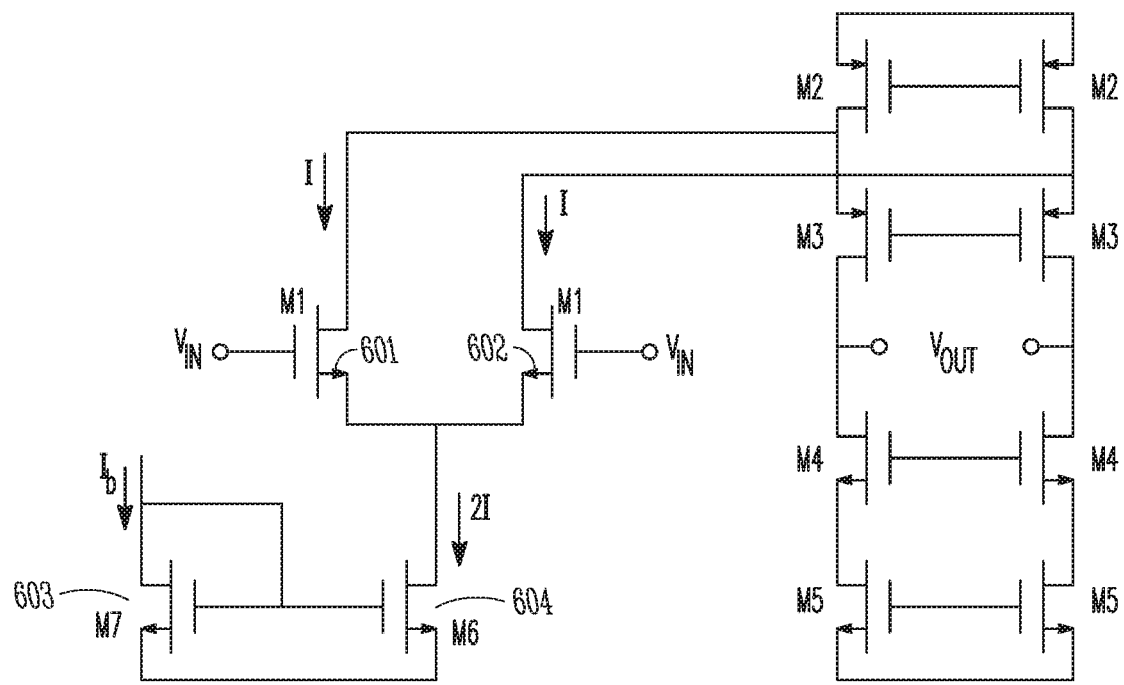
FIG. 6 is a schematic diagram of an amplifier circuit, such as in accordance with various embodiments.

FIG. 6 is a schematic diagram of an amplifier circuit, such as in accordance with various embodiments. This circuit illustrates the determination of the transconductance $g_m$ and the time constant τ of the integrator circuit. This circuit is only one example of an amplifier circuit. Other embodiments may implement an amplifier using different components.

The transconductance $g_m$ may be determined by:

$$g_m = \sqrt{2\mu C_{ox}\left(\frac{W}{L}\right)_1 I}$$

where W is a fabrication width of each of the input transistors 601, 602, L is a fabrication length of each of the input transistors 601, 602 (the size of the two input transistors is assumed to be the same), I is the current through each input branch that includes the input transistors 601, 602, and $C_{ox}$ is a fixed capacitance parameter determined by the fabrication process. Transistor M7 603 generates a bias voltage for transistor M6 604 from a current source (e.g., current $I_b$).

The time constant τ of the circuit of FIG. 6 may be determined by:

$$\tau = \frac{C_L}{g_m}$$

where $C_L$ is the integrator load capacitance.

Figure 7:
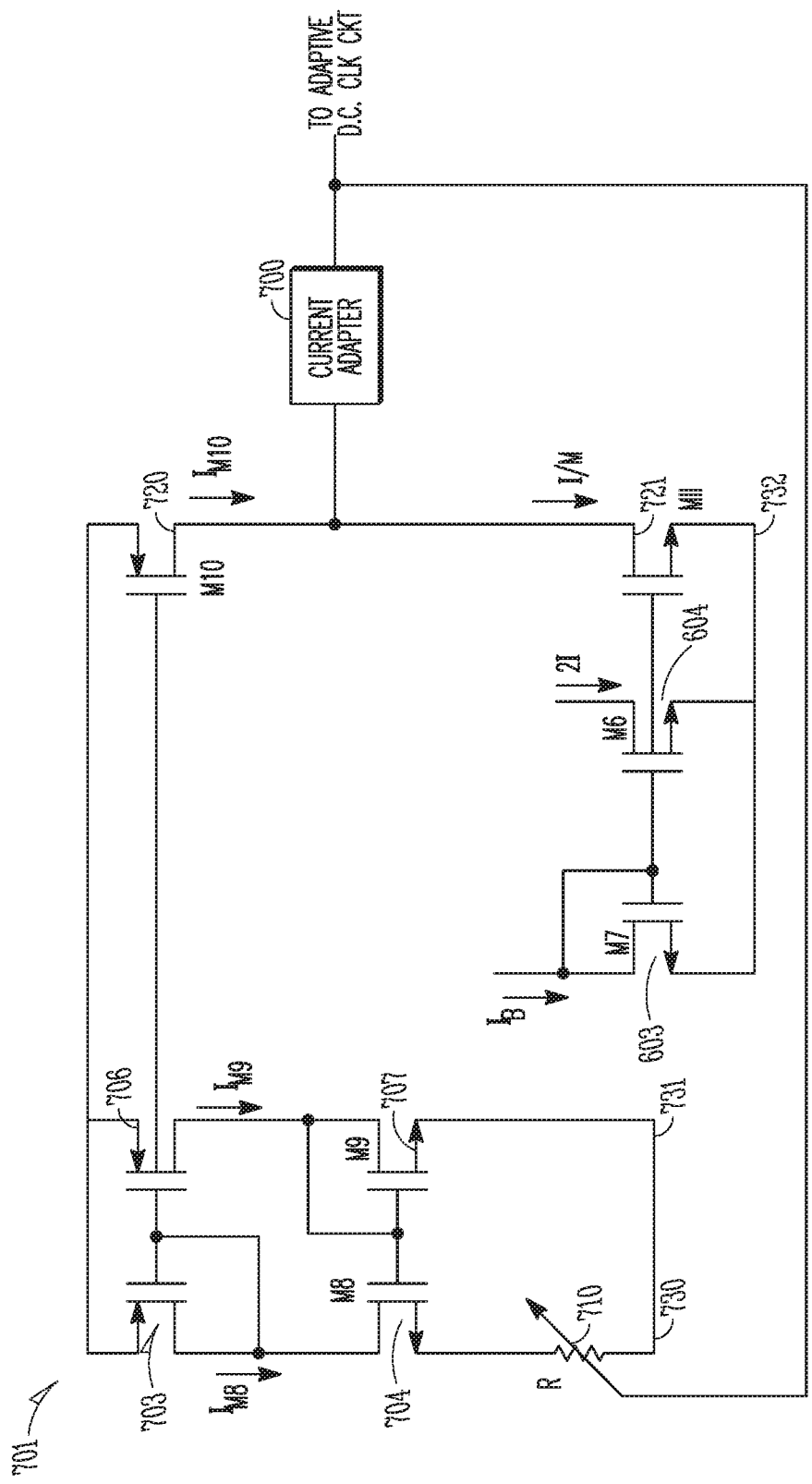
FIG. 7 is a schematic diagram of the constant transconductance bias circuit with a feedback circuit, such as in accordance with various embodiments.

FIG. 7 is a schematic diagram of a constant transconductance bias circuit with a feedback circuit, such as in accordance with various embodiments. This circuit is used to adjust the conductance of R to the transconductance of the input transistors 601, 602 of the integrator amplifier, as illustrated in FIG. 6. The feedback circuit adjusts a resistance R 710 as described subsequently.

The circuit includes a current adapter circuit 700, a transconductance bias circuit 701, and a plurality of transistors 720-723. The transconductance bias circuit 701, includes a plurality of transistors 703, 704, 706, 707, and a variable resistance 710.

The transconductance bias circuit 701 includes a first path 730 and a second path 731 configured as a current mirror. In the first path, a first transistor 703 is coupled in series with a second transistor 704 that is coupled in series with the variable resistance 710. In the second path 731, a first transistor 706 is coupled in series with a second transistor 707. The two paths are coupled in parallel at a top common node and a bottom common node.

Transistors 703 and 707 are each coupled in a diode configuration where their respective control gates are coupled to their drain nodes. The control gates of the first transistors 703, 706 of each path 730, 731 are coupled together and the control gates of the second transistors 704, 707 of each path 730, 731 are coupled together.

The output of the current adapter circuit 700 is coupled to the variable resistance 710 such that the current adapter circuit 700 varies the resistance of the variable resistance 710. The structure and operation of the current adapter circuit 700 and variable resistance 710 are discussed subsequently in greater detail with reference to FIG. 8.

Path 732 includes transistors 720, 721 coupled in series and the input node of the current adapter circuit 700 is coupled to a common node between these transistors 720, 721. The source node of transistor 720 is coupled to the top common node of the two paths 730, 731. The control gate of the transistor 720 is coupled to the control gates of the first transistors 703, 706. The drain of the transistor 720 is coupled to the input of the current adapter 700.

The control gates of transistors 721-723 are all coupled together and the sources of transistors 721-723 are coupled together. The gate of transistor 723 is coupled to its drain in a diode configuration. The drain of transistor 721 is coupled to the input of the current adapter circuit 700 and in series with transistor 720 as part of path 732. Transistor M7 603 is the same transistor M7 603 in FIG. 6 that generates the bias voltage from the current source and current $I_b$. Transistor M6 704 is the same transistor M6 604 in FIG. 6 that provides the current of 2I for the amplifier.

Paths 730-732 are each current mirror circuits. Transistor 722 and path 732 mirror the current from transistor 723, thus the current of path 732 and transistor 722 are proportional. The current $I_{M8}$ through the first path is equal to $I_{M9}$ through the second path 731 and $I_{M10}$ through the third path 732 (i.e., $I_{M8}=I_{M9}=I_{M10}$).

In the constant transconductance bias circuit 701, the value of the resistance R 710 is adjusted so that the current $I_{M8}$ and $I_{M9}$ is equal to I/M where I is the current of amplifier input transistors M1 601, 602 of FIG. 6 and M is an integer set by a factor of size difference between transistor M9 707 and transistors M1 601, 602.

The physical size of transistor M9 is fabricated so that it is proportional to the size of each of input transistors M1 601, 602. The size of M9 707 may be represented by $$\left(\frac{W}{L}\right)_{M9}$$

where W is the fabricated width of the transistor M9 707 and L is the fabricated length. Thus, $$\left(\frac{W}{L}\right)_{M9} = \left(\frac{W}{L}\right)_{M1} / M$$

and the transconductance of transistor M9 707 is 1/M of the transconductance of the input transistors M1 601, 602. This $g_m$ may be expressed by:

$$g_m = \sqrt{2\mu C_{ox}\left(\frac{W}{L}\right)_{M9}\frac{I}{M}} = \sqrt{2\mu C_{ox}\left(\frac{W}{L}\right)_{M1}\frac{I}{M^2}} = \frac{g_{m1}}{M}.$$

K is an integer constant determined at fabrication to express a size difference between transistor M8 704 and transistor M9 707. The fabricated sizes of transistors M8 704 and M9 707 is given as:

$$\left(\frac{W}{L}\right)_{M8} = K\left(\frac{W}{L}\right)_{M9}$$

so that the transconductance of transistor M9 707 may be expressed as:

$$g_{m9} = \frac{2(\sqrt{K}-1)}{\sqrt{K}R}.$$

For the purposes of simplicity, K=4 and M=1 so that $g_{m9}$=1/R and the $g_m$ of the input transistors M1 601, 602 can be expressed as 1/R and the time constant τ of the amplifier circuit is expressed by:

$$\tau = \frac{C_L}{g_{m1}} = C_L R$$

where $C_L$ is the integrator load capacitance.

In operation, since the series circuits of each of paths 730-732 are current mirror circuits, their current magnitudes are equal. Thus, adjusting the resistance value R 710 to change the current $I_{M8}$ in path 730 will change the currents $I_{M9}$ and $I_{M10}$ in paths 731 and 732, respectively. The current 2I through transistor 722 is equal to the sum of the currents through each of the amplifier input transistors M1 601, 602. The current I is compared with the current $I_{M9}$ through path 731. If the current $I_{M10}$ is larger than I, then the current $I_{M9}$ is also larger. In this example, M=1, so the current of path 731 is I, not 2I, thus the current in 731 is the same as the current of each input transistor 601 or 602 individually and not the sum.

When current $I_{M10}$ is greater than I, the input to the current adapter circuit 700 will be pulled high since this current is larger than current I/M (M=1, in this example) through transistor M11 721. When the input to the current adapter circuit 700 is pulled high, the circuit 700 increases the resistance value R 710. This decreases current $I_{M8}$ which decreases current $I_{M9}$ and thus, decreases current $I_{M10}$.

Conversely, when current $I_{M10}$ is less than I, the input to the current adapter circuit 700 will be pulled low by the larger current I/M through transistor M11 721. When the input to the current adapter circuit 700 is pulled low, the circuit 700 decreases the resistance value R 710. This increases current $I_{M8}$ which increases current $I_{M9}$ and thus, increases current $I_{M10}$.

After the calibration, the resistance of R is 1/gm1, where gm1 is the input transconductance of input transistors 601, 602. The circuit of FIG. 7 calibrates the resistance of R such that it is equal to the reciprocal of the transconductance of the input transistors 601, 602. A resistance identical to resistance R is then used in the non-overlapping clock generation circuit as discussed subsequently with reference to FIG. 9.

Figure 8:
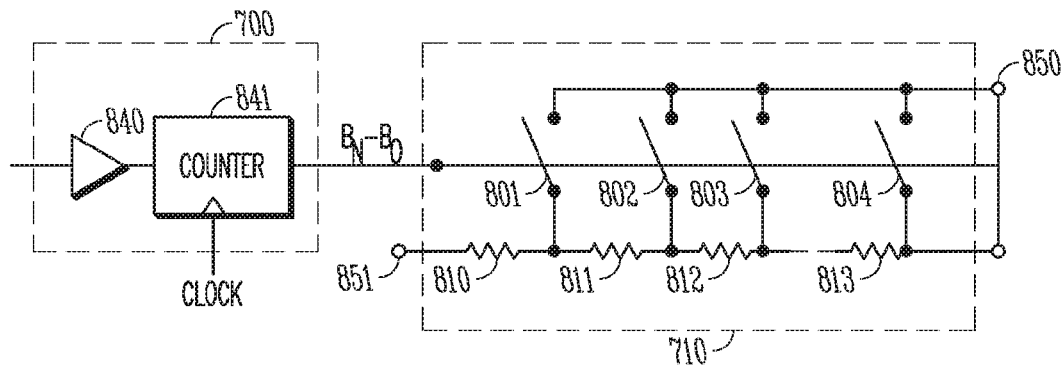
FIG. 8 is a schematic diagram of a current adapter circuit, such as in accordance with the embodiment of FIG. 7.

FIG. 8 is a schematic diagram of the current adapter circuit 700, such as in accordance with the embodiment of FIG. 7. This schematic illustrates only one example of a circuit for adjusting the resistance R 710 of FIG. 7. Other embodiments may calibrate this resistance in other ways.

The current adapter circuit 700 comprises a comparator 840 and a counter circuit 841. The resistance circuit 710 comprises a plurality of resistances (e.g., resistors) 810-813 and a plurality of addressable switches 801-804.

An output of the comparator 840 is coupled to an enable input of the counter circuit 841. A clock signal CLOCK is coupled to the clock input of the counter circuit 841. The resistors 810-813 are coupled in series from an input node 851 of the resistance circuit 710. Each switch 801-804 is coupled between a respective common node between two adjacent series connected resistors 810-813 and an output node 850 of the circuit 710. The switches 801-804 are controlled by the count output $b_N$-$b_0$ from the counter circuit 841. The resistance circuit 710 structure is shown for purposes of illustration. As each switch 801-804 is activated, its associated resistor 810-813 is added to the previous resistors 810-813 for a total resistance R between the nodes 850, 851. Other resistance circuits may be used in which the resistance may be varied in other ways.

In operation, the input of the current adapter circuit 700 is a variable voltage depending on the current $I_{M10}$ of FIG.

7. The comparator 840 is set with a reference voltage such that when the input voltage is greater than or equal to a predetermined threshold voltage, the output of the comparator is a logic high. When the input voltage is less than the reference voltage, the output of the comparator is a logic low. This enable input is input to the comparator 840. The counter circuit 841 is enabled to count the rising edges of the clock signal CLK when the enable input is an enable state (e.g., logic high). The counter circuit 841 is disabled from counting when the enable input is a disable state (e.g., logic low).

The counter circuit 841 generates the count output $b_N$-$b_0$ that is input to the resistance circuit 710. The count output $b_N$-$b_0$ represents a control word that is input to the resistance circuit 710 to control activating or deactivating the addressable switches 801-804. Since the total resistance R of the resistance circuit 710 is increased or decreased by activation or deactivation of particular switches 801-804, the control word controls the total resistance R of the circuit of FIG. 7 so that current $I_{M10}$ is equal to current I/M.

In an embodiment, the counter circuit 841 is reset to a value of I at power up of the circuit so that the total resistance R starts out relatively low. Thus, the resistance R can be slowly and incrementally increased until $I_{M10}$ is equal to current I/M.

Figure 9:
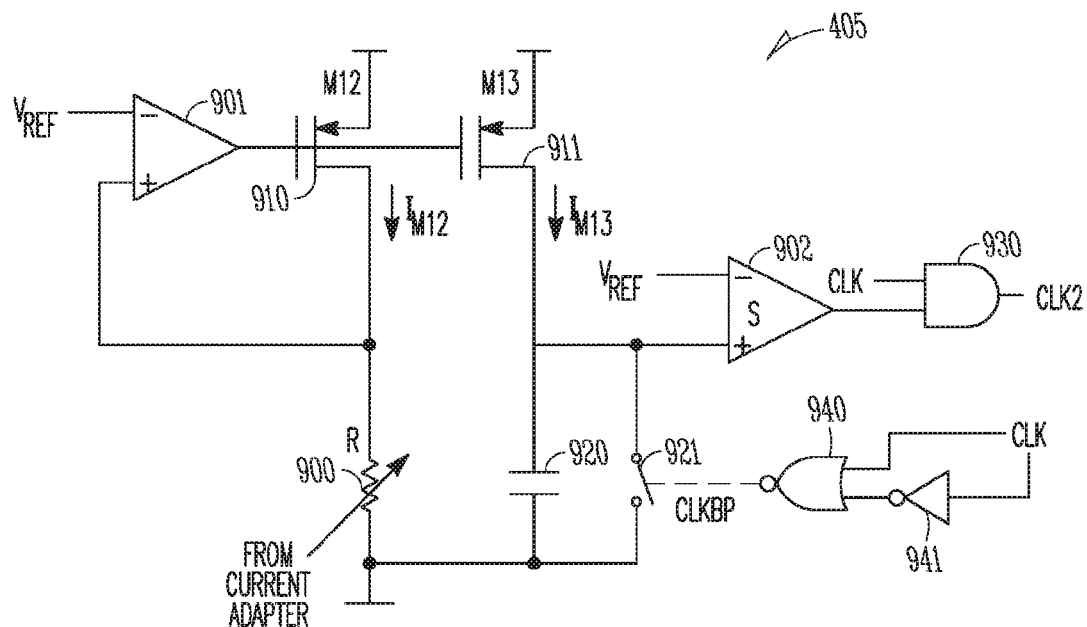
FIG. 9 is a schematic diagram of the adaptive control duty cycle clock generation circuit 405, such as in accordance with various embodiments.

FIG. 9 is a schematic diagram of the adaptive control duty cycle clock generation circuit 405, such as in accordance with various embodiments. This circuit includes a replica resistance 900 of resistance R 710 of FIG. 7 as well as a replica capacitance 920 of the load capacitance $C_L$ of the amplifier circuit. The replica resistance 900 is the same size and connected to the circuit of FIG. 7 so that the resistance R 900 in the circuit of FIGL 9 is adjusted simultaneously with the resistance R 710 of FIG. 7.

The adaptive pulse width control circuit further includes a first amplifier 901, a first comparator 902, a first transistor 910, a second transistor 911, a switch 921 and an AND function 930. The first amplifier 901 is coupled to a reference voltage $V_{REF}$ at its negative input node. The control gates of first and second transistors 910, 911 are coupled to the output of the amplifier 901. The first transistor 910 and resistance 900 (i.e., replica of the resistance R) are coupled in series between two voltage nodes (e.g., $V_{DD}$ and GND). A common node between the resistance 900 and the first transistor 910 is coupled to the positive input of the amplifier 901.

The second transistor 911 and the capacitance 920 (i.e., replica of integrator load capacitance) are coupled in series between the two voltage nodes. A positive input to the comparator 902 is coupled to a common node between the second transistor 911 and the capacitance 920. A negative input to the comparator 902 is coupled to the reference voltage $V_{REF}$. The switch 921 is coupled between the positive amplifier input and one of the voltage nodes (e.g., GND). The switch 921 is controlled by a clock signal CLKBP.

An output of the second amplifier 902 is coupled to an input of the AND function 930. A second input to the AND function 930 is coupled to the clock signal CLK. An output of the AND function 930 outputs the clock signal CLK2.

In operation, the circuit including the first transistor 910, resistance 900 and amplifier 901 acts as a current generation. The voltage $V_{REF}$ is a constant voltage generated by a bandgap circuit. The current $I_{M12}$ of the series circuit of the first transistor 910 and resistance R 900 is given by $V_{REF}$/R. The fabrication size of the second transistor 911 is 1/N of the size of the first transistor 910. Thus, the current $I_{M13}$ through the series circuit of the second transistor 911 and the capacitance 920 is given by $$\frac{V_{REF}/R}{N}.$$

The current $I_{M13}$ charges the capacitance 920. Thus, the time for the current to charge the capacitance 920 to $V_{REF}$ on the positive input of the second amplifier 902 is set, as $NC_LR$, so the settling time is $N*\tau$. When the capacitance voltage reaches $V_{REF}$, the output of the comparator 902 goes high.

The CLKBP is generated by the negative edge of the CLK using the NOR function 940 with CLK and $\overline{CLK}$, output from an inverter 941, as inputs. The NOR function 940 and inverter 941 circuit catches the negative edge of the CLK and outputs a pulse. The pulse width is determined by the delay of the inverter 941.

The CLKBP clock signal activates the switch 921 when it goes high. Activating this switch pulls the capacitance 920 discharges the capacitance 920 to ground causing the positive input to the amplifier 902 to be 0V and, thus, the output clock CLK2 to go to 0V. The pulse width of the CLKBP clock is relatively very short, just enough to discharge the capacitance 920 and let the current $I_{M13}$ to recharge the capacitance. The AND function 930 ensures that the CLK2 signal is only high while the CLK signal is high and the output of comparator 902 is high.

Figure 10:
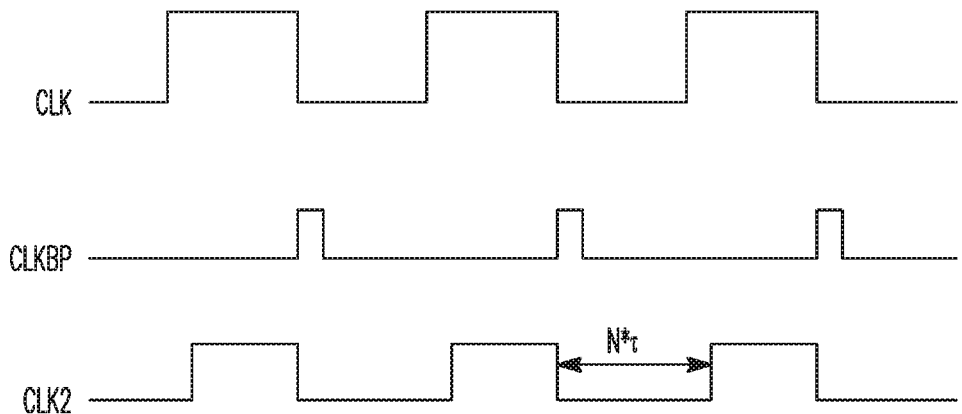
FIG. 10 is a timing diagram showing the non-overlapping clock and adaptively controlled duty cycle clock, such as in accordance with the embodiment of FIG. 9.

FIG. 10 is a timing diagram showing the non-overlapping clock and adaptively controlled duty cycle clock, such as in accordance with the embodiment of FIG. 9. This figure shows the CLK signal on top and the non-overlapping CLK2 signal generated by the adaptive control duty cycle clock generation circuit of FIG. 9.

Figure 11:
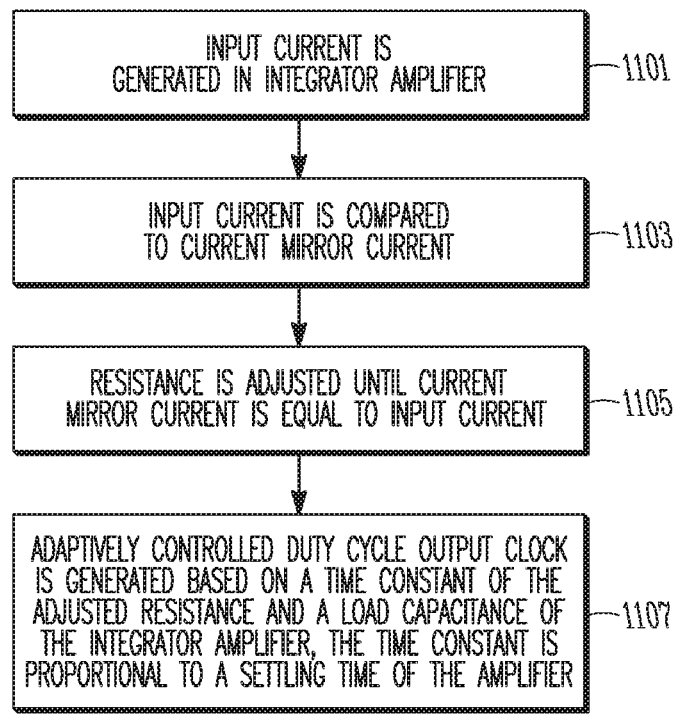
FIG. 11 is a flowchart of a method of operation of the adaptively controlled duty cycle clock generation circuit for an analog-to-digital converter with an integrator amplifier, such as in accordance with various embodiments.

FIG. 11 is a flowchart of a method of operation of the adaptively controlled duty cycle clock generation circuit for an analog-to-digital converter with an integrator amplifier, such as in accordance with various embodiments.

In block 1101, an input current is generated in the integrator amplifier. In block 1103, the input current is compared to a current mirror current where the current mirror comprises a resistance. In block 1105, the resistance is adjusted until the current mirror current is equal to the input current. In block 1107, the adaptively controlled duty cycle output clock is generated based on a time constant of the adjusted resistance and a load capacitance of the integrator amplifier circuit, wherein the time constant is proportional to a settling time of the integrator amplifier. Generating the adaptively controlled duty cycle output clock comprises charging the capacitance to a first voltage, comparing the first voltage to a reference voltage, generating a first output voltage when the first voltage is equal to or greater than the reference voltage, and generating a second output voltage when the first voltage is less than the reference voltage, where the second output voltage is less than the first output voltage.

Figure 12:
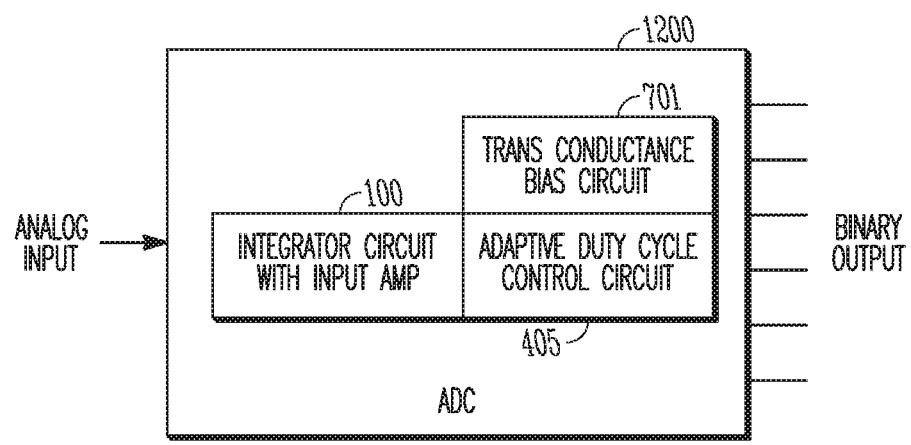
FIG. 12 is a block diagram of an analog-to-digital converter circuit, such as in accordance with various embodiments.

FIG. 12 is a block diagram of an analog-to-digital converter circuit 1200, such as in accordance with various embodiments. This circuit 1200 is a simplified block diagram to highlight the various embodiments disclosed herein.

The circuit 1200 includes at least one integrator circuit 100 that includes an input amplifier. One example of such a circuit is illustrated in FIG. 1. The adaptive duty cycle control circuit 405, as shown in FIG. 4, is coupled to the integrator circuit 100 to generate the adaptive duty cycle clocks for the integration operations. The transconductance bias circuit 701 is coupled to the adaptive duty cycle control circuit 405 to provide the adaptively control of the duty cycle of the input clock based on the product of the resistance in the transconductance bias circuit 701 and a capacitance, where the product is proportional to a settling time of the integrator. The resistance is determined based on the transconductance of the integrator amplifier.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A clock generation circuit to generate an adaptively controlled duty cycle output clock for an analog-to-digital converter having an integrator with an integrator amplifier, the clock generation circuit comprising:

an adaptive duty cycle control circuit to generate the adaptively controlled duty cycle output clock having a duty cycle adaptively controlled based on a first resistance that is adjusted based on an input transconductance of the integrator amplifier.

2. The clock generation circuit of claim 1, further comprising a transconductance bias circuit with feedback comprising:

a plurality of current mirror circuit paths coupled in parallel, a first path comprising a second resistance and configured to have a first current;

an input current transistor configured to have an input integrator amplifier current; and a current adapter circuit coupled to the plurality of current mirror circuit paths and the input current transistor, wherein the current adapter is configured to adjust the first resistance and the second resistance based on a comparison of the first current and the input integrator amplifier current.

3. The clock generation circuit of claim 2, wherein the current adapter is configured to increase the first resistance and the second resistance in response to the first current being greater than the input integrator amplifier current.

4. The clock generation circuit of claim 2, wherein the current adapter circuit comprises:

a comparator having an input coupled to the plurality of current mirror circuit paths; and a counter having an enable input coupled to a comparator output, wherein the counter is configured to count clock pulses at a clock input when the comparator output is in an enable state.

5. The clock generation circuit of claim 2, wherein the first resistance and the second resistance each comprise:

a plurality of addressable switches coupled to the current adapter circuit; and a plurality of series connected resistors, wherein each of the plurality of addressable switches is coupled between an output node and a respective common node between adjacent ones of the plurality of series connected resistors.

6. The clock generation circuit of claim 2, wherein a second path of the plurality of current mirror circuit paths comprise a first transistor coupled in series with a second transistor, the first transistor configured to have the first current and the second transistor configured to have a second current, wherein when the first current is greater than the second current, an input of the current adapter circuit is pulled up to a higher voltage than if the first current is less than the second current.

7. The clock generation circuit of claim 1, further comprising:

an adaptive duty cycle control circuit configured to generate the adaptively controlled duty cycle output clock from an input clock having a duty cycle, the adaptive duty cycle control circuit comprising:

a current generator circuit including an amplifier and a second resistance, wherein the second resistance is set based on the input transconductance of the integrator;

a current mirror circuit including a transistor and capacitance, the current mirror circuit coupled in parallel with the current generator circuit, wherein the transistor is configured to act as a current mirror and the duty cycle of the input clock is adaptively controlled based on a product of the resistance and the capacitance and the product is based on a settling time of the integrator;

a second amplifier having a first input coupled to a reference voltage and a second input coupled to a common node between the transistor and the capacitance; and a switch coupled to the integrator amplifier input and in parallel with the capacitance, wherein the switch is configured to be activated in response to a clock pulse such that the activated switch pulls down the second input to zero volts; and a non-overlapping clock generation circuit coupled to the adaptive duty cycle control circuit, the non-overlapping clock generation circuit configured to generate a plurality of non-overlapping clocks controlled by the adaptively controlled duty cycle output clock.

8. The clock generation circuit of claim 7, further comprising an AND function coupled to an output of the second amplifier, the AND function configured to generate the adaptively controlled duty cycle output clock in response to the input clock.

9. The clock generation circuit of claim 7, wherein the plurality of non-overlapping clocks include an integrating phase clock of the integrator and the resistance is further set such that a width of integrating phase clock is adjusted.

10. An analog-to-digital converter comprising:

an integrator circuit comprising an input amplifier configured to have an input current; and a clock generation circuit coupled to the integrator circuit and configured to generate an adaptively controlled duty cycle output clock signal based on an input clock, the clock generation circuit comprising a resistance that is adjusted based on an input transconductance of the input amplifier, wherein the duty cycle of the output clock signal is adaptively controlled based on the adjusted resistance.

11. The analog-to-digital converter of claim 10, wherein the integrator circuit further comprises a plurality of switches configured to be controlled by a plurality of non-overlapping clocks based on the adaptively controlled duty cycle output clock signal.

12. The analog-to-digital converter of claim 11, wherein the plurality of non-overlapping clocks control an integrating phase and a sampling phase.

13. The analog-to-digital converter of claim 10, wherein the resistance is configured to be adjusted based on a comparison between the input current and a transconductance bias circuit current.

14. The analog-to-digital converter of claim 13, wherein the transconductance bias circuit comprises a current adapter circuit having a counter configured to transmit a control word to the resistance to adjust the resistance.

15. The analog-to-digital converter of claim 14, wherein the transconductance bias circuit comprises a first transistor in series with a second transistor where the counter is configured to count clock pulses in response to a current in the first transistor being larger than a current in the second transistor.

16. The analog-to-digital converter of claim 15, wherein the first transistor is configured to pull up an input to the current adapter circuit when the current in the first transistor is larger than the current in the second transistor.

17. A method for generating an adaptively controlled duty cycle output clock for an analog-to-digital converter having an integrator circuit, the method comprising:

adjusting a resistance of a current mirror until a current mirror current is equal to an input current of the integrator circuit; and generating the adaptively controlled duty cycle output clock based on a time constant of the adjusted resistance and a load capacitance of the integrator circuit, wherein the time constant is based on a settling time of the integrator circuit.

18. The method of claim 17, wherein generating the adaptively controlled duty cycle output clock comprises:

charging the capacitance to a first voltage;

comparing the first voltage to a reference voltage;

generating a first output voltage when the first voltage is equal to or greater than the reference voltage; and generating a second output voltage when the first voltage is less than the reference voltage, where the second output voltage is less than the first output voltage.

19. The method of claim 18, further comprising clock pulses periodically activating a switch to discharge the capacitance.

20. The method of claim 18, further comprising logically ANDing the adaptively controlled duty cycle output clock with an input clock to generate an output clock signal to the integrator.

* * * * *